United States Patent [19]

Doering

[11] Patent Number: 4,661,374
[45] Date of Patent: Apr. 28, 1987

[54] METHOD OF MAKING MOS VLSI SEMICONDUCTOR DEVICE WITH METAL GATE AND CLAD SOURCE/DRAIN

[75] Inventor: Robert R. Doering, Plano, Tex.

[73] Assignee: Texas Instruments Incorporated, Dallas, Tex.

[21] Appl. No.: 638,440

[22] Filed: Aug. 7, 1984

[51] Int. Cl.⁴ ............................................. H01L 21/28
[52] U.S. Cl. ...................................... 427/88; 156/652; 156/656; 156/657; 156/664; 29/571; 427/93
[58] Field of Search ..................... 427/85, 86, 93, 38; 148/DIG. 116, 141, 147; 156/652, 656, 657, 664; 29/571

[56] References Cited

U.S. PATENT DOCUMENTS 4,234,362 11/1980 Riseman .............................. 148/187
4,356,040 10/1982 Fu et al. ................................ 148/1.5

OTHER PUBLICATIONS

J. S. Chang, "Selective Reactive Ion Etching of Silicon Dioxide", *Solid State Technology*, Apr. 1984.
Chernicki et al., "Formation of Side Wall Oxide Spacers by Reaction Ion Etching in $CHF_3$ and $O_2$" Extended Abstracts, vol. 83-2, Fall Meeting, The Electrochemical Society.
C. J. Kirches, et al., "Fabricating a Gate Field-Effect Transistor", IBM Tech. Discl. Bul., vol. 13, No. 3, Aug. 1970.

*Primary Examiner*—John D. Smith
*Attorney, Agent, or Firm*—John G. Graham

[57] ABSTRACT

Metal-gate transistors with metal silicide cladding of the source/drain regions, as may be used in very high density dynamic RAM devices, are made by a process in which the metal gate is encapsulated in oxide and the cladding is self aligned with the encapsulated gate. A thin coating of a refractory metal is applied to the source/drain areas and heated to react with the exposed silicon. The unreacted metal is removed by an etchant that does not disturb the metal gate or the silicide.

18 Claims, 4 Drawing Figures

METHOD OF MAKING MOS VLSI SEMICONDUCTOR DEVICE WITH METAL GATE AND CLAD SOURCE/DRAIN

BACKGROUND OF THE INVENTION

This invention relates to the manufacture of semiconductor devices, and more particularly to a method for making metal-gate MOS VLSI devices using metal silicide clading of source/drain regions.

In the manufacture of very high density MOS VLSI devices such as the 1-Megabit dynamic RAM, the electrical resistance of small-geometry elements has necessitated the use of metal gates and interconnects instead of polycrystalline silicon, and the use of silicide or "clad" source/drain regions. The processes used for creating a metal silicide in the surface of the source and drain regions often are not compatible with the metal gate, which must be in place when the clading is performed because self-alignment is necessary. For example, the etchant used to remove unreacted metal after the silicide is formed may etch the metal gate, or the silicide itself.

It is the principal object of the invention to provide an improved method of making metal-gate MOS VLSI devices, particularly high density memory cell arrays or the like. Another object is to provide a method of making an improved interconnect system and metal-gate transistor structure as may be used in very high density memory arrays. A further object is to provide an improved metal gate and clad silicon system with low sheet resistance and minimal process and materials complexity.

SUMMARY OF THE INVENTION

In accordance with one embodiment of the invention, metal-gate transistors with metal silicide cladding of the source/drain regions, as may be used in very high density dynamic RAM devices, are made by a process in which the metal gate is encapsulated in oxide and the cladding is self aligned with the encapsulated gate. A thin coating of a refractory metal is applied to the source/drain areas and heated to react with the exposed silicon. The unreacted metal is removed by an etchant that does not disturb the metal gate or the silicide.

BRIEF DESCRIPTION OF THE DRAWINGS

The novel feature believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
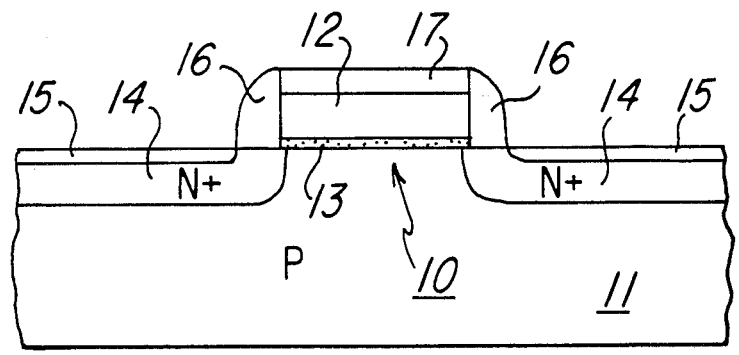
FIG. 1 is an elevation view in section, greatly enlarged, of a very small part of a semiconductor integrated circuit chip, showing an MOS transistor made according to the invention.

Referring to FIG. 1, an N-channel MOS field effect transistor 10 is illustrated which is made according to the invention. This transistor is formed at a face of a silicon substrate 11, and usually would be part of an integrated circuit such as a 1-Megabit dynamic RAM containing a large number of such transistors. The transistor 10 includes a metal gate 12, in this example composed of molybdenum, separated from the silicon face by a thin silicon oxide layer 13. The source and drain of the transistor are created by N+ regions 14 in the silicon, self-aligned with the gate 12. Titanium silicide regions 15 are formed in the silicon surface over the N+ source/drain regions 14, self-aligned with sidewall-oxide spacers 16. A cap oxide layer 17, along with the sidewall spacers, protect the molybdenum metal of the agate 12 when the silicide regions 15 are being formed.

Figure 2:
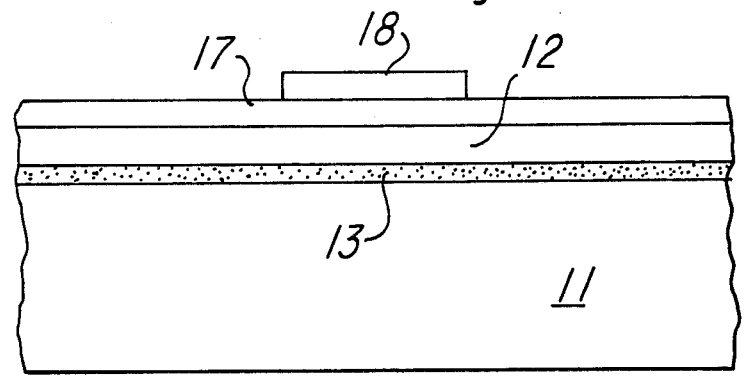
FIGS. 2-4 are elevation views in section of the device of FIG. 1, at successive stages in the manufacture thereof.

A method of making the transistor device of FIG. 1 will be described with reference to FIGS. 2-4, which correspond to the section view of FIG. 1 but represent successive stages in the manufacturing process. The device commonly would be made as part of a CMOS device having P and/or N tanks in the substrate 11, and some type of isolation method would be used, such a thick field oxide or field plate isolation, so it will be understood that this description will represent only a part of a more comprehensive manufacturing method. The first step of the process, to the extent pertinent to this invention, is growing the gate oxide 13 on the suitably cleaned silicon substrate 11, as seen in FIG. 2. This gate oxide may be, for example, 200 Å in thickness, grown by thermal oxidation. Next, the layer of molybdeum is applied to form what will be the gate 12. This layer is about 3000 Å in thickness, and is applied by sputtering. Then, the cap oxide 17 is applied by plasma-enhanced chemical vapor deposition of silicon oxide, leaving a coating of about 2000 Å over the entire face. A photoresist coating is applied then exposed to light through a mask which defines the gate area, and developed, to leave a segment 18 of photoresist as seen in FIG. 2, to create an etch mask. The oxide layer 17 is first etched using RIE or other anisotropic etch to leave vertical sidewalls, followed by another etch to remove the unwanted molybdenum of the gate layer 12. The thin oxide 13 may be left in place, or removed at this point. The photoresist 18 is then stripped.

Figure 3:
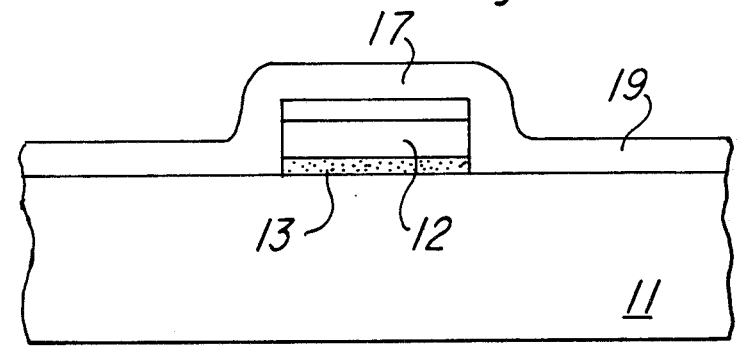

As seen in FIG. 3, a coating 19 of oxide is deposited over the face of the slice by an isotropic method such as plasma-enhanced chemical vapor deposition so that the sidewalls will be coated to the same depth as the horizontal face; this thickness may be 2500 to 5000 Å.

Figure 4:
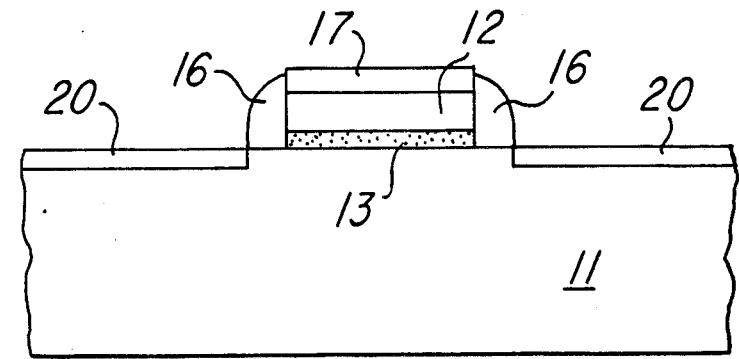

Referring to FIG. 4, the oxide layer 19 is subjected to an anistropic etch to remove all of the oxide from the horizontal faces, but to leave the sidewall oxide segments 16 in place. The cap oxide 17 and the sidewall oxide 16 totally encapsulates the molybdenum gate 12 at this point. A source/drain implant is performed, creating shallow N+ regions 20 in the silicon face, self-aligned with the sidewall oxide 16. This may be a phosphorus implant at a dosage of 10 exp 14 to 10 exp 15 per sq. cm., at 100 KeV. An anneal step drives in the phosphorus of the regions 20 to create the N+ source and drain regions 14 of FIG. 1; this anneal may be at 900° C. for 1½ hours in an inert atmosphere such as argon, for example. The phosphorus diffuses beneath the sidewall spacers to create a lightly-doped drain (LDD) transistor structure which reduces the problems of impact ionization in very small geometry transistors, one micron channel length or less. Any residual oxide from this operation is then removed by immersing in dilute buffered HF for about a minute. A thin layer of titanium metal is next applied to the surface of the slice by sputtering to a thickness of about 1000 Å, and heated to react with the silicon, forming the thin layer 15 of titanium silicide $TiSi_2$. This heat step is conducted at about 675° C. for about one-half hour in argon and forming gas.

According to the invention, the unreacted titanium metal is now removed from the face of the slice by exposing the slice to a 20% hydrochloric acid solution at about 60° C. for perhaps ten to fifteen minutes. This stripping operation would ordinarily employ an etchant such as piranha ($H_2SO_4 + H_2O_2$), which tends to remove some of the $TiSi_2$, increasing the source/drain resistance, and to seep through cracks in the encapsulating oxide 16 and 17 to dissolve some of the molybdenum gate 12. The object here is to remove about 1000 Å of titanium from silicon oxide without attacking exposed $TiSi_2$, $SiO_2$ or Mo. The $TiSi_2$ and $SiO_2$ are insoluble in HCl, and HCl etches titanium significantly faster than molybdenum. Specifically, it was shown that a 20% HCl solution etches titanium ten times faster than molybdenum at 60° C., whereas a 15% solution etches about seven times faster.

After the excess titanium has been removed, the titanium silicide is annealed by heating in an inert atmosphere such as argon, for 15 min. at 800° C., for example.

Fabrication of the integrated circuit continues, including deposition of interlevel oxide, removal of oxide in contact areas, deposition of other metal layers, etc., as may be required. For example, a CMOS dynamic RAM using a twin-well process and grounded field plate isolation is disclosed in copending application Ser. No. 626,572, filed July 2, 1984 by Doering & Armstrong, now U.S. Pat. No. 4,561,170, assigned to Texas Instruments, of which the process of this invention may be a part.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a semiconductor device comprising the steps of:
   forming an electrode on a face of a semiconductor body,
   covering the top and sides of said electrode with an insulator coating,
   depositing a reactive material on said face, and subjecting said body to a treatment to cause the material to react with the surface of the semiconductor body to create a conductive compound,
   and removing the unreacted material from said face with an etchant which does not substantially attack said insulator coating or said conductive compound, said etchant tending to react with the material of said electrode on contact, the electrode being isolated from said etchant by said insulator coating on top and sidewalls to prevent reaction with the material of said electrode.

2. A method according to claim 1 wherein said semiconductor body is silicon, said electrode is a metal, said insulator coating is silicon oxide, and said conductive compound is a silicide.

3. A method according to claim 2 wherein said metal is a refractory metal, and said conductive compound is a silicide of a refractory metal different from said electrode.

4. A method according to claim 3 wherein said refractory metal of said electrode is molybdenum and said conductive compound is titanium silicide.

5. A method according to claim 4 wherein said reactive material is titanium, and said treatment is a heat treatment.

6. A method according to claim 5 wherein said etchant is an HCl solution.

7. A method according to claim 6 wherein said HCl solution is about 20% in water.

8. A method according to claim 5 including the step of implanting an impurity into said face after said step of covering said electrode with an insulator coating.

9. A method according to claim 8 wherein the step of covering the top and sides of said electrode includes the step of coating the face with a layer of silicon oxide then anisotropically etching to leave silicon oxide on the sidewalls of said electrode.

10. A method according to claim 9 wherein said electrode is the gate of a field-effect transistor.

11. A method according to claim 10 wherein said step of removing employs a solution of HCl in water as said etchant.

12. A method according to claim 1 wherein said step of covering said electrode with insulator coating includes the steps of applying a first insulator coating over a layer of the material of said electrode, then selectively etching both the first insulator coating and the layer of material of the electrode to leave the electrode with a first insulator layer on top of the electrode, then isotropically applying a second insulator coating on said face, then anisotropically etching said second insulator coating to leave sidewall areas of second insulator but to remove the second insulator from flat areas of said face.

13. A method of making a metal gate and clad source/drain structure in a process for manufacture of MOS integrated circuits, comprising the steps of:
   forming a metal gate on a face of a silicon body by applying a thin layer of molybdenum overlying a thin layer of silicon oxide on said face, and applying a coating of oxide on top of said gate and on the sidewalls of said gate totally encapsulating said gate;
   forming a titanium silicide layer in the surface of said source/drain regions self-aligned with said oxide on the sidewalls of the metal gate, by depositing a layer of titanium metal on said face, heating the body to react the titanium with silicon, and etching to remove unreacted titanium from the face using a selective etchant which does not attack the titanium silicide, said etchant tending to remove said molybdenum on contact therewith,
   said metal gate being isolated from said etchant by said coating of oxide on top and on sidewalls of said gate to thereby prevent the etchant from removing material of said metal gate.

14. A method according to claim 13 wherein said body is P type, and said source/drain regions are N+ type.

15. A method accordin to claim 14 wherein said etchant is a solution of hydrochloric acid.

16. A method according to claim 15 wherein said etchant is an aqeous solution of about 20% HCl.

17. A method according to claim 16 wherein said step of etching is for about 10 to 15 minutes at about 60° C.

18. A method according to claim 13 wherein said step of covering said metal gate with said oxide coating includes the steps of applying a first oxide coating over a layer of the metal of said gate, then selectively etching both the first oxide coating and the layer of metal of the gate to leave the metal gate with a first oxide layer on top of the metal gate, then isotropically applying a second oxide coating on said face, then anisotropically etching said second oxide coating to leave sidewall areas of second oxide but to remove the second oxide coating from flat areas of said face.

* * * * *